(12) United States Patent
Tsai et al.

(10) Patent No.: US 11,635,530 B2
(45) Date of Patent: Apr. 25, 2023

(54) X-RAY SENSING DEVICE

(71) Applicant: Au Optronics Corporation, Hsinchu (TW)

(72) Inventors: Chia-Hsiu Tsai, Hsinchu (TW); Chia-Ming Chang, Hsinchu (TW); Ruei-Pei Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/512,639

(22) Filed: Oct. 27, 2021

(65) Prior Publication Data

US 2022/0334271 A1 Oct. 20, 2022

(30) Foreign Application Priority Data

Apr. 19, 2021 (TW) .................................. 110113877

(51) Int. Cl.
  *G01T 1/20* (2006.01)
  *C03C 4/08* (2006.01)
  *H01L 27/146* (2006.01)

(52) U.S. Cl.
  CPC ............ *G01T 1/2018* (2013.01); *C03C 4/087* (2013.01); *H01L 27/14618* (2013.01); *H01L 27/14663* (2013.01)

(58) Field of Classification Search
  CPC . G01T 1/2018; C03C 4/087; H01L 27/14618; H01L 27/14663
  See application file for complete search history.

(56) References Cited

U.S. PATENT DOCUMENTS

| 5,777,335 | A | * | 7/1998 | Mochizuki | G01T 1/2018 250/370.11 |
| 6,472,665 | B1 | * | 10/2002 | Ishisaka | G01T 1/2018 378/98.3 |
| 7,948,177 | B2 | | 5/2011 | Kwak | |
| 10,777,774 | B2 | | 9/2020 | Ishii | |
| 2005/0248270 | A1 | | 11/2005 | Ghosh et al. | |
| 2007/0178796 | A1 | | 8/2007 | Kwak | |
| 2010/0054418 | A1 | * | 3/2010 | Okada | G01T 1/2018 378/114 |
| 2011/0079729 | A1 | | 4/2011 | Partain et al. | |
| 2016/0282484 | A1 | * | 9/2016 | Tonami | G01T 1/2018 |
| 2020/0020886 | A1 | | 1/2020 | Ishii | |

FOREIGN PATENT DOCUMENTS

| CN | 110447308 | | 11/2019 |
| JP | 2013246063 A | * | 12/2013 |
| TW | M274163 | | 9/2005 |
| TW | 200607383 | | 2/2006 |
| TW | I326133 | | 6/2010 |
| TW | 202006954 | | 2/2020 |

* cited by examiner

Primary Examiner — Kiho Kim
(74) Attorney, Agent, or Firm — JCIPRNET

(57) ABSTRACT

An X-ray sensing device includes a photosensitive element, lead-containing glass, and an X-ray conversion structure. The photosensitive element is configured to sense light having a first wavelength. The lead-containing glass overlaps the photosensitive element. The X-ray conversion structure is disposed on the lead-containing glass. The lead-containing glass is located between the photosensitive element and the X-ray conversion structure. The X-ray conversion structure is configured to at least partially convert X-rays into light having the first wavelength.

7 Claims, 8 Drawing Sheets

X-RAY SENSING DEVICE

CROSS-REFERENCE TO RELATED APPLICATION

This application claims the priority benefit of Taiwan application serial no. 110113877, filed on Apr. 19, 2021. The entirety of the above-mentioned patent application is hereby incorporated by reference herein and made a part of this specification.

BACKGROUND

Technical Field

The present invention relates to an X-ray sensing device, and more particularly to an X-ray sensing device including lead glass.

Description of Related Art

With the advancement of medical technology, many doctors use X-rays to check the physical condition of patients. For example, before performing an operation, doctors use X-rays to examine the bones of patients, thereby reducing the risk of operation failure.

Currently, X-ray sensing devices include many photosensitive elements, and these photosensitive elements are usually controlled by thin film transistors or other active/passive elements. However, as the use time of the X-ray sensing device increases, X-rays continuously irradiate the semiconductor channel layer in the thin film transistor. The semiconductor channel layer in the thin film transistor is prone to deterioration after being repeatedly irradiated by X-rays, which causes the image produced by the X-ray sensing device to be blurred. If the image produced by the X-ray sensing device is blurred, it is easy for the doctor to misjudge the patient's bone condition. Therefore, there is an urgent need for a method that can solve the aforementioned problems.

SUMMARY

The present invention provides an X-ray sensing device, which can improve the problem of degradation of active elements.

At least one embodiment of the present invention provides an X-ray sensing device. The X-ray sensing device includes a photosensitive element, lead-containing glass, and an X-ray conversion structure. The photosensitive element is configured to sense light having a first wavelength. The lead-containing glass overlaps the photosensitive element. The X-ray conversion structure is disposed above the lead-containing glass. The lead-containing glass is located between the photosensitive element and the X-ray conversion structure. The X-ray conversion structure is configured to at least partially convert X-rays into light having a first wavelength.

DESCRIPTION OF THE EMBODIMENTS

Figure 1A:
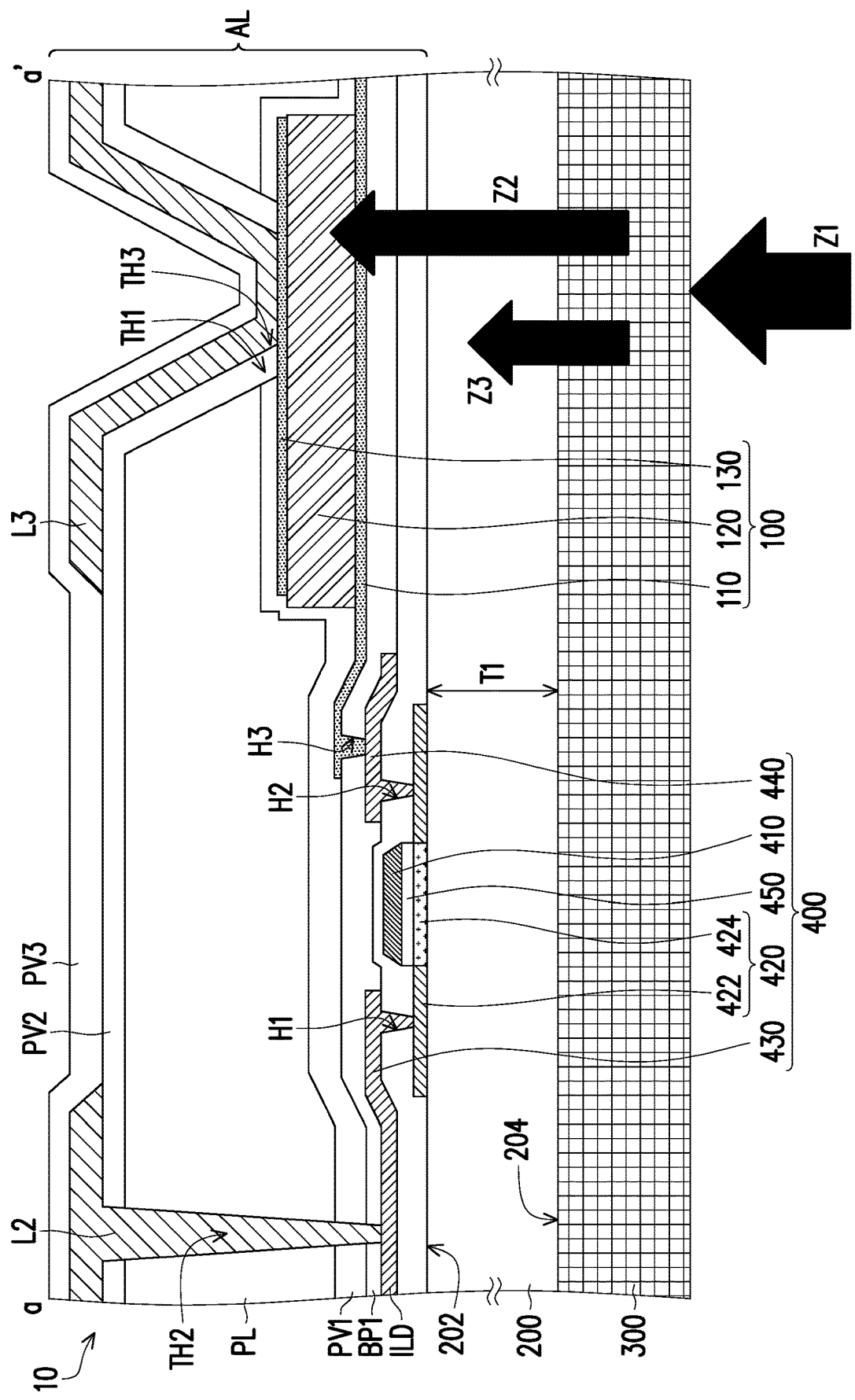
FIG. 1A is a schematic cross-sectional view of an X-ray sensing device according to an embodiment of the invention.
Figure 1B:
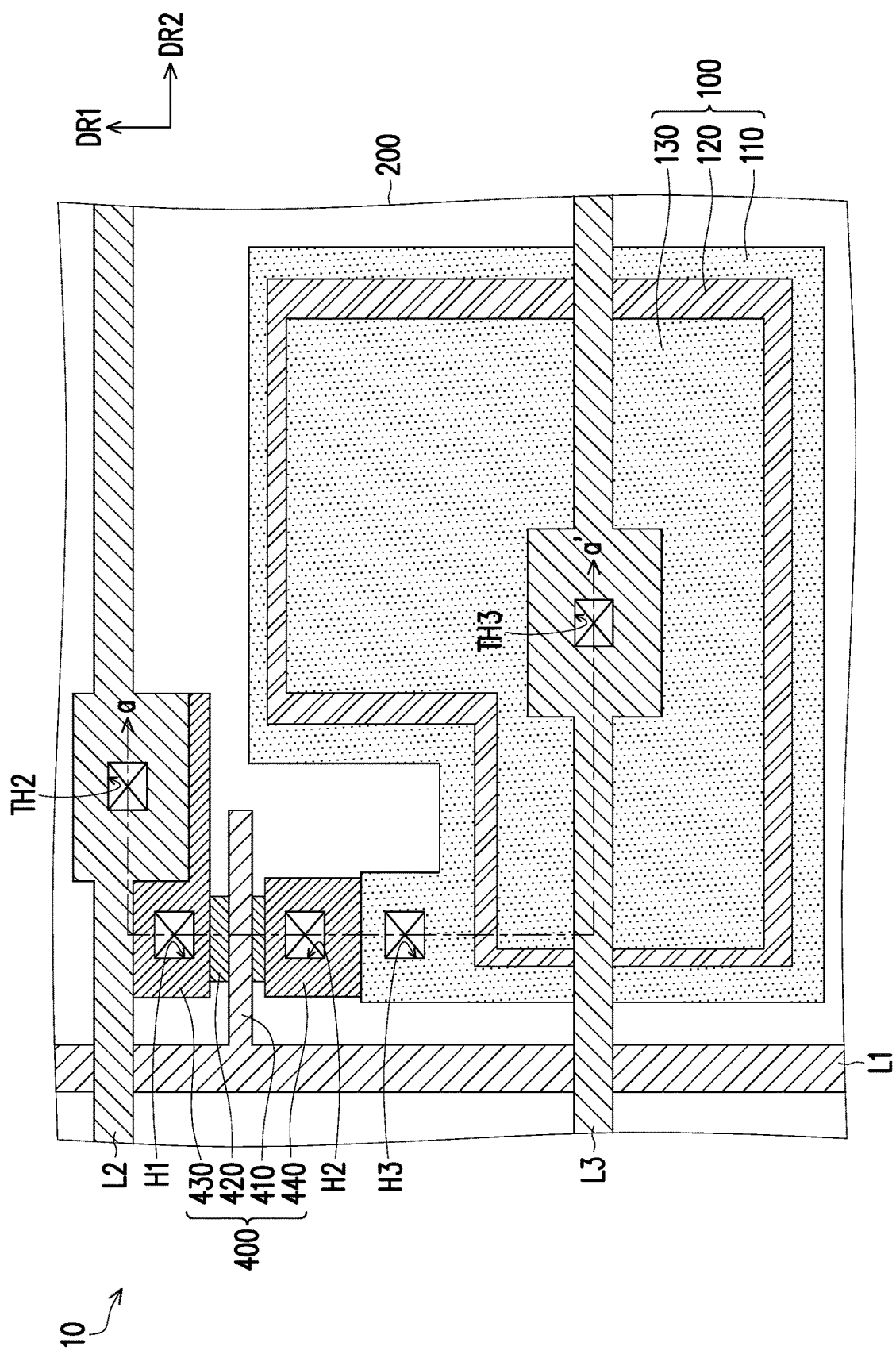
FIG. 1B is a schematic top view of an X-ray sensing device according to an embodiment of the invention.

FIG. 1A is a schematic cross-sectional view of an X-ray sensing device according to an embodiment of the invention. FIG. 1B is a schematic top view of an X-ray sensing device according to an embodiment of the invention. FIG. 1A corresponds to the position of the line a-a' in FIG. 1B, and part of the components in FIG. 1A are omitted in FIG. 1B.

Referring to FIG. 1A and FIG. 1B, the X-ray sensing device 10 includes a photosensitive element 100, a lead-containing glass 200 and an X-ray conversion structure 300. In this embodiment, the X-ray sensing device 10 further includes an active element 400, a first signal line L1, a second signal line L2, and a third signal line L3. In this embodiment, the active element layer AL is formed on the first surface 202 of the lead-containing glass 200, and the X-ray conversion structure 300 is formed on the second surface 204 of the lead-containing glass 200, wherein the active element layer AL includes the photosensitive element 100, the active element 400, the first signal line L1, the second signal line L2, and the third signal line L3.

In the lead-containing glass 200, the weight percentage of lead oxide is 10 wt % to 75 wt %, and the thickness T1 of the lead-containing glass 200 is 0.5 mm to 5 mm, for example, 0.5 mm to 3 mm. In some embodiments, the lead-containing glass 200 has a transmittance of greater than or equal to about 85% for visible light with a wavelength of 400 nm to 700 nm (for example, 550 nm), and has transmittance of less than or equal to about 11.6% for X-ray with a wavelength of about 0.1 nm to 10 nm.

The active element 400 is formed on the lead-containing glass 200. In this embodiment, the active element 400 includes a gate 410, a semiconductor channel layer 420, a source 430, and a drain 440.

The semiconductor channel layer 420 is formed on the lead-containing glass 200. In some embodiments, the semiconductor channel layer 420 includes low temperature polysilicon (LTPS), indium gallium zinc oxide (IGZO) or other semiconductor materials. In some embodiments, the semiconductor channel layer 420 includes two conductive regions 422 and a channel region 424 located between the two conductive regions 422. In some embodiments, the doping concentration of the conductive region 422 is different from the doping concentration of the channel region 424.

The first signal line L1 and the gate 410 are formed on the lead-containing glass 200. The gate 410 is overlapping with the channel region 424 of the semiconductor channel layer 420, and a gate insulating layer 450 is sandwiched between the gate 410 and the semiconductor channel layer 420. In this embodiment, the first signal line L1 is electrically connected to the gate 410. The first signal line L1 and the gate 410 belong to the same conductive layer. For example, the first signal line L1 and the gate 410 are formed by patterning the same conductive material layer. In some embodiments, the gate insulating layer 450, the first signal line L1 and the gate 410 are patterned through the same etching process. In this embodiment, the first signal line L1 and the gate 410 have a single-layer or multi-layer structure, and the materials of the first signal line L1 and the gate 410 include metal, nitride of metal materials, oxide of metal materials, oxynitride of metal materials, or other suitable materials, or stacked layers of metal materials and other conductive materials.

In some embodiments, the gate insulating layer 450 is only located between the gate 410 and the semiconductor channel layer 420 and between the first signal line L1 and the semiconductor channel layer 420, but the invention is not limited thereto. In other embodiments, the gate insulating layer 450 is not patterned through the same etching process as the first signal line L1 and the gate 410, and the gate insulating layer 450 extends from the semiconductor channel layer 420 onto the lead-containing glass 200.

The interlayer dielectric layer ILD is formed on the first signal line L1, the gate 410, the semiconductor channel layer 420, and the lead-containing glass 200.

The source 430 and the drain 440 are formed on the interlayer dielectric layer ILD. The source 430 and the drain 440 are respectively electrically connected to the semiconductor channel layer 420 through the through holes H1 and H2, wherein the through holes H1 and H2 penetrate the interlayer dielectric layer ILD. The source 430 is electrically connected to the second signal line L2. In this embodiment, the source 430 and the drain 440 belong to the same conductive film layer. For example, the source 430 and the drain 440 are formed by patterning the same conductive material layer. In this embodiment, the source 430 and the drain 440 have a single-layer or multi-layer structure, and the materials of the source 430 and the drain 440 include metals, nitrides of metal materials, oxides of metal materials, and oxynitrides of metal materials, or other suitable materials, or stacked layers of metal materials and other conductive materials.

In this embodiment, the active element 400 is illustrated by taking a top gate type thin film transistor as an example, but the invention is not limited thereto. According to other embodiments, the active element 400 is a bottom gate type thin film transistor or other types of thin film transistors.

The insulating layer BP1 is located on the active element 400. The photosensitive element 100 is located on the insulating layer BP1, and the lead-containing glass 200 overlaps the photosensitive element 100. The photosensitive element 100 includes a first electrode 110, a photosensitive layer 120 and a second electrode 130.

The first electrode 110 is formed on the insulating layer BP1 and is electrically connected to the drain 440 of the active element 400 through the through hole H3, wherein the through hole H3 penetrates the insulating layer BP1. In this embodiment, the first electrode 110 includes a transparent conductive material, such as indium tin oxide, indium zinc oxide, aluminum tin oxide, aluminum zinc oxide, indium gallium zinc oxide, or stacked layers of at least two of the foregoing materials.

The photosensitive layer 120 is formed on the first electrode 110. In this embodiment, the photosensitive layer 120 includes stacked layers of a P-type semiconductor, an intrinsic semiconductor, and an N-type semiconductor. In other words, in this embodiment, the photosensitive element 100 is a PIN photodiode. In other embodiments, the material of the photosensitive layer 120 includes silicon-rich oxide, silicon-rich nitride, silicon-rich oxynitride, silicon-rich carbide, silicon-rich oxycarbide, hydrogenated silicon-rich oxide, hydrogenated silicon-rich nitride, hydrogenated silicon-rich carbide or a combination thereof.

The second electrode 130 is formed on the photosensitive layer 120. In this embodiment, the first electrode 110 is closer to the lead-containing glass 200 than the second electrode 130. In some embodiments, the second electrode 130 includes a transparent conductive material, such as indium tin oxide, indium zinc oxide, aluminum tin oxide, aluminum zinc oxide, indium gallium zinc oxide, or stacked layers of at least two of the foregoing materials, but the present invention is not limited thereto. In other embodiments, the second electrode 130 includes a light-reflecting conductive material, such as metal.

The insulating layer PV1 is formed on the photosensitive element 100 and the insulating layer BP1. The flat layer PL is formed on the insulating layer PV1. The through hole TH1 penetrates the flat layer PL and the insulating layer PV1. The insulating layer PV2 is formed on the flat layer PL.

The second signal line L2 and the third signal line L3 are formed on the insulating layer PV2. The second signal line L2 is electrically connected to the source 430 of the active element 400 through the through hole TH2, wherein the through hole TH2 penetrates the insulating layer BP1, the insulating layer PV1, the flat layer PL, and the insulating layer PV2. The third signal line L3 is electrically connected to the second electrode 130 of the photosensitive element 100 through the through hole TH3, wherein the through hole TH3 is overlapping with the through hole TH1, and the through hole TH3 penetrates the insulating layer PV2.

The second signal line L2 and the third signal line L3 belong to the same conductive layer. For example, the second signal line L2 and the third signal line L3 are formed by patterning the same conductive material layer. In this embodiment, the second signal line L2 and the third signal line L3 have a single-layer or multi-layer structure, and the materials of the second signal line L2 and the third signal line L3 include metals, nitrides of metal materials, and oxides of metal materials, oxynitride of metal materials, or other suitable materials, or stacked layers of a metal material and other conductive materials. The insulating layer PV3 is covering the second signal line L2 and the third signal line L3.

In this embodiment, the first signal line L1 is substantially extending along the first direction DR1, and the second signal line L2 and the third signal line L3 are substantially extending along the second direction DR2, wherein the first direction DR1 is staggered with the second direction DR2.

The X-ray conversion structure 300 is disposed on the lead-containing glass 200. The lead-containing glass 200 is located between the photosensitive element 100 and the X-ray conversion structure 300.

In this embodiment, the X-ray Z1 enters the X-ray sensing device 10 from one side of the X-ray conversion structure 300. The X-ray conversion structure 300 is configured to at least partially convert the X-ray Z1 into light Z2 having a first wavelength. In the present embodiment, the X-ray conversion structure 300 converts 40% to 95% of the X-ray Z1 into light Z2 with the first wavelength, and another part of the unconverted X-ray Z3 passes through the X-ray conversion structure 300. In this embodiment, the light Z2 is visible light, and the first wavelength is 400 nm to 700 nm.

Since the transmittance of the lead-containing glass 200 to visible light with a wavelength of 400 nm to 700 nm (for example, 550 nm) is greater than or equal to about 85%, most of the light Z2 can pass through the lead-containing glass 200. The photosensitive element 100 is configured to sense light Z2 having a first wavelength. Since most of the light Z2 can pass through the lead-containing glass 200, the resolution of the X-ray sensing device 10 will not be significantly affected by the lead-containing glass 200.

In addition, the transmittance of the lead-containing glass 200 for X-ray Z3 with a wavelength of about 0.1 nanometers to 10 nanometers is less than or equal to about 11.6%. Only a small portion of the X-rays Z3 or no X-rays Z3 can pass through the lead-containing glass 200. Therefore, it is possible to prevent the active element 400 from deteriorating due to being irradiated by the X-ray Z3.

Figure 2A:
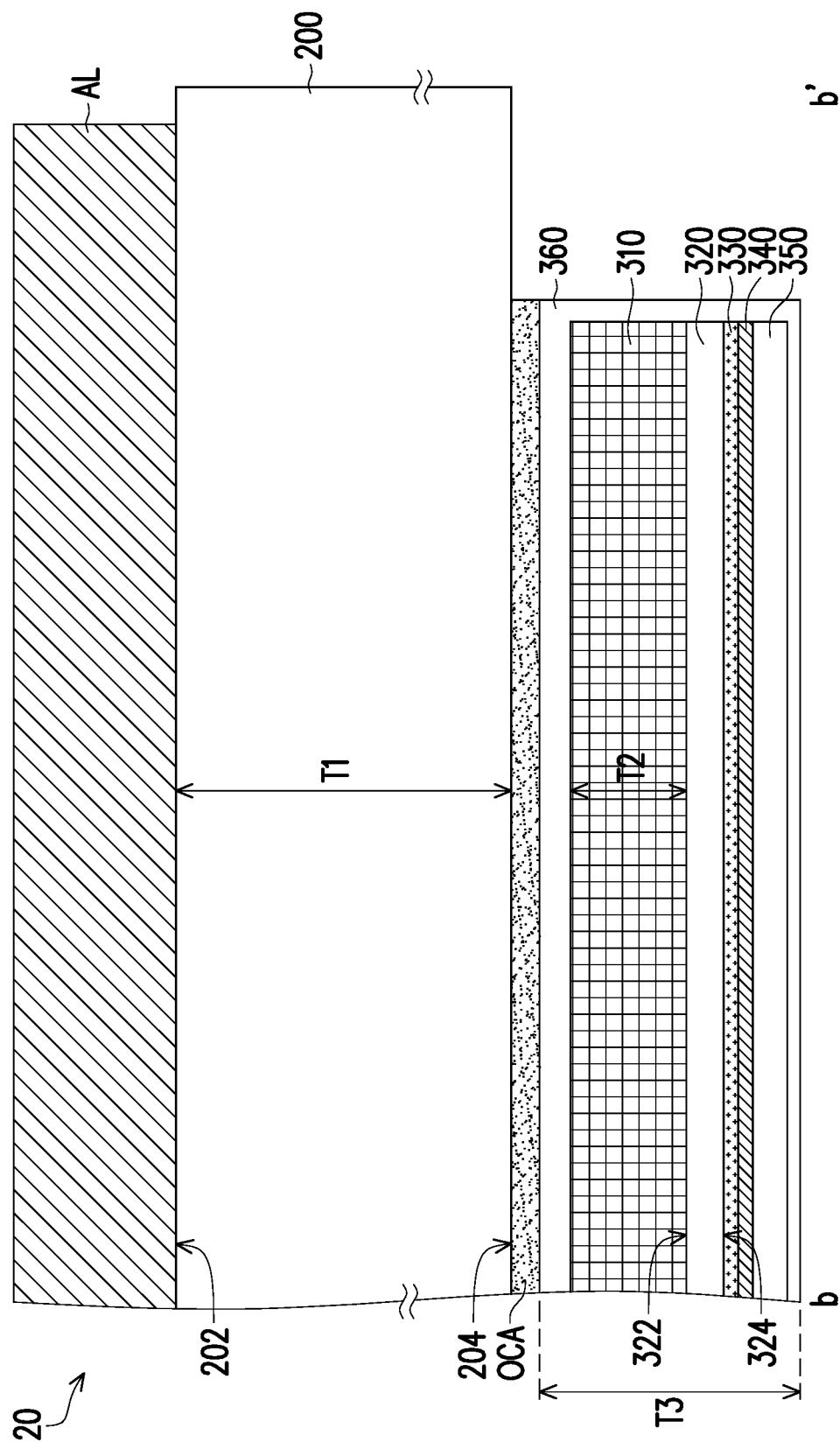
FIG. 2A is a schematic cross-sectional view of an X-ray sensing device according to an embodiment of the invention.
Figure 2B:
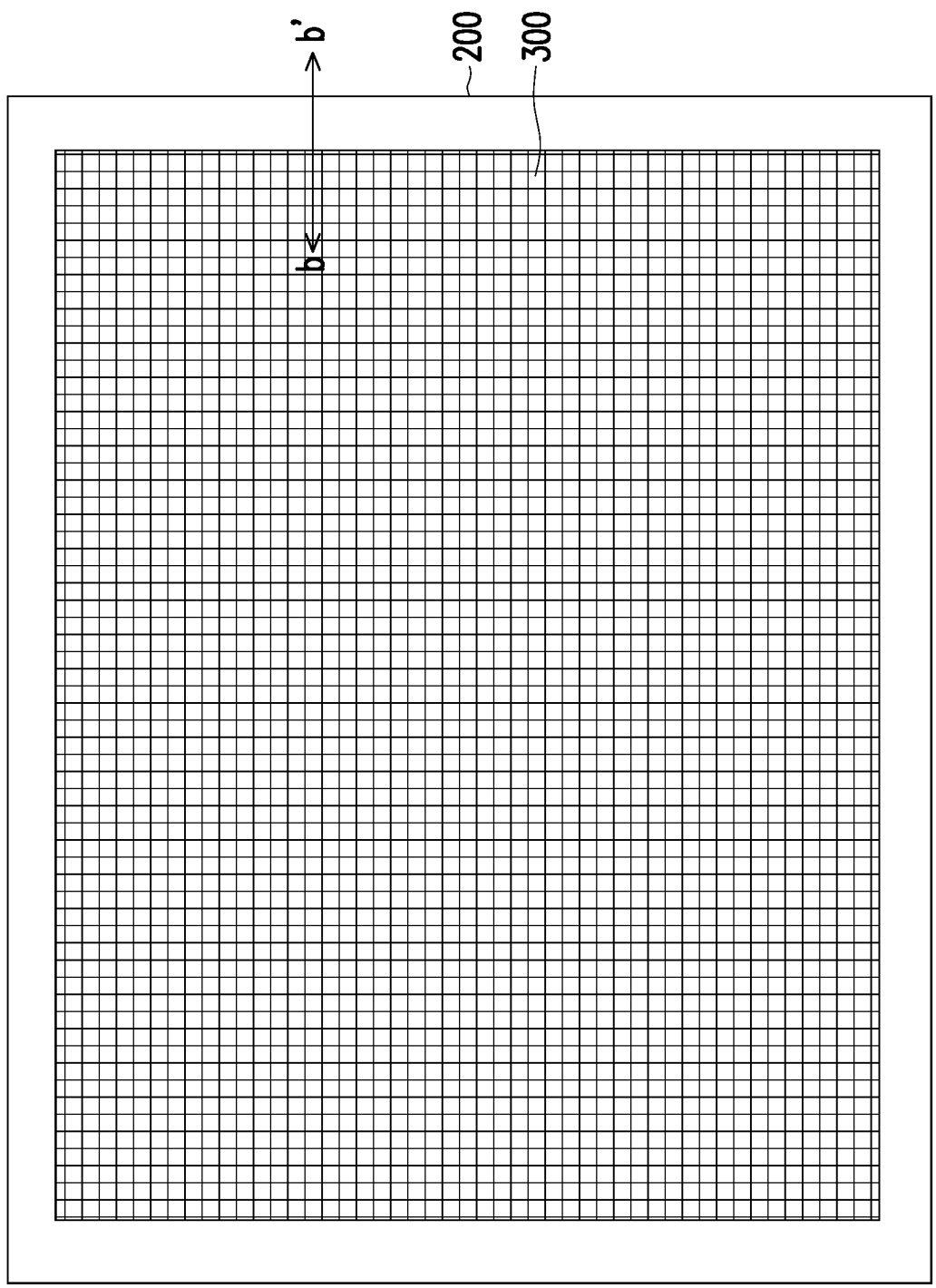
FIG. 2B is a schematic bottom view of an X-ray sensing device according to an embodiment of the invention.

FIG. 2A is a schematic cross-sectional view of an X-ray sensing device according to an embodiment of the invention. FIG. 2B is a schematic bottom view of an X-ray sensing device according to an embodiment of the invention. FIG. 2A corresponds to the position of the line b-b' in FIG. 2B, and part of the components in FIG. 2A are omitted in FIG. 2B.

It should be noted herein that, in embodiments provided in FIG. 2A and FIG. 2B, element numerals and partial content of the embodiments provided in FIG. 1A and FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 2A and FIG. 2B, the active element layer AL and the X-ray conversion structure 300 are located on opposite sides of the lead-containing glass 200, respectively.

In the X-ray sensing device 20, the X-ray conversion structure 300 includes a scintillator layer 310, a first flexible substrate 320, an adhesive layer 330, a metal layer 340, a second flexible substrate 350, and an anti-moisture layer 360.

The first flexible substrate 320 has a first surface 322 and a second surface 324 opposite to the first surface 322. The scintillator layer 310 is formed on the first surface 322 of the first flexible substrate 320. In some embodiments, the scintillator layer 310 includes thallium-activated cesium iodide scintillators (CsI:Tl scintillators). The scintillator layer 310 is, for example, disposed on the first flexible substrate 320 in an amount of 1790 g/m$^2$±180 g/m$^2$, and the thickness T2 of the scintillator layer 310 is, for example, 500 μm±50 μm. The adhesive layer 330 is formed on the second surface 324 of the first flexible substrate 320.

The second flexible substrate 350 is overlapping with the first flexible substrate 320. The metal layer 340 is formed on the second flexible substrate 350 and is overlapping with the scintillator layer 310. The adhesion layer 330 adheres to the metal layer 340. In some embodiments, the material of the metal layer 340 includes aluminum.

The anti-moisture layer 360 surrounds the scintillator layer 310, the first flexible substrate 320, the adhesive layer 330, the metal layer 340, and the second flexible substrate 350. The thickness of the moisture-resistant layer 360 is, for example, about 20 μm.

In this embodiment, the total thickness T3 of the X-ray conversion structure 300 is about 0.5 mm to 1.4 mm.

In this embodiment, the optical adhesive layer OCA is formed on the second surface 204 of the lead-containing glass 200, and the optical adhesive layer OCA is adhered to the X-ray conversion structure 300. In other words, in this embodiment, the X-ray conversion structure 300 is adhered to the lead-containing glass 200 through the optical adhesive layer OCA.

Figure 3A:
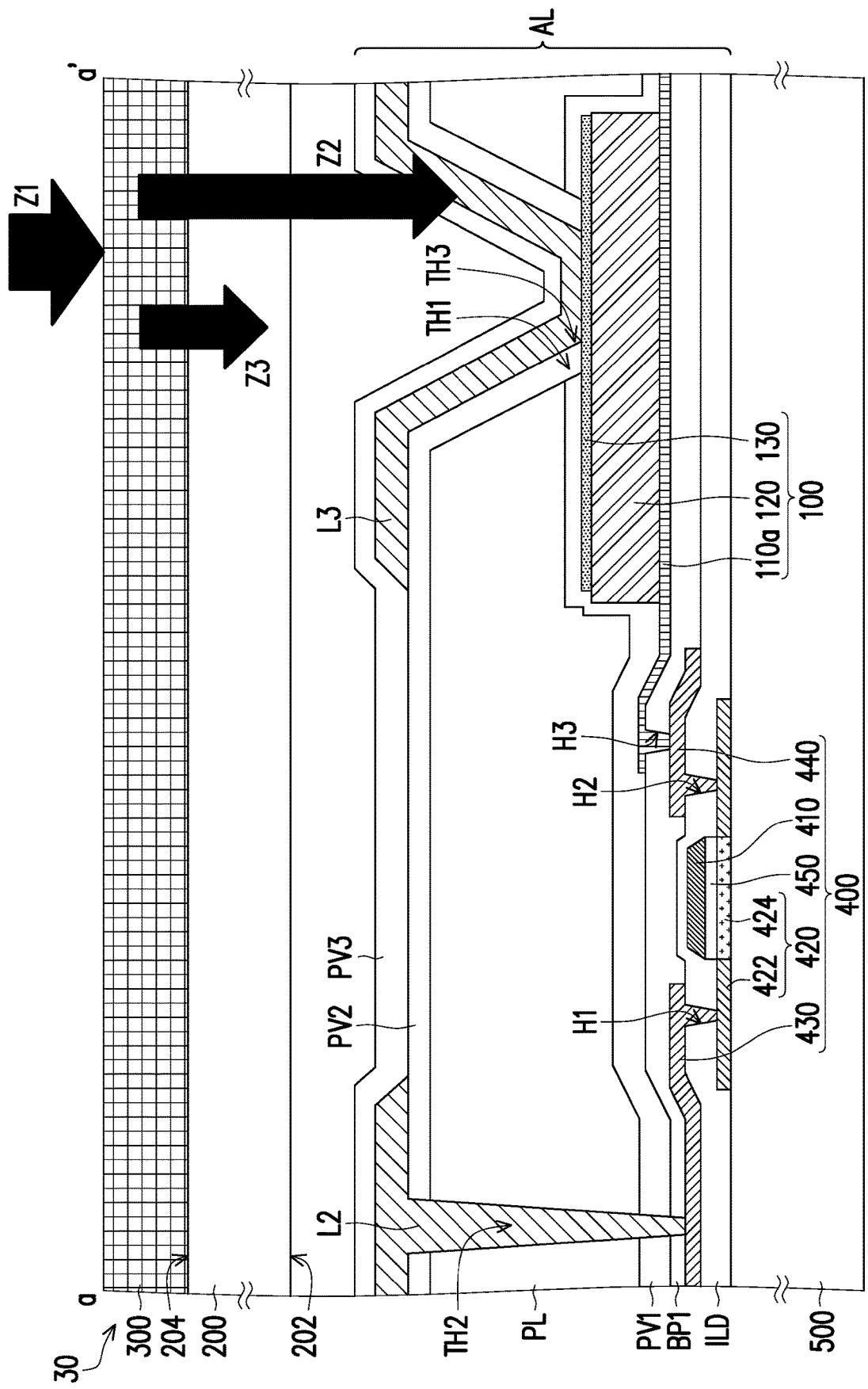
FIG. 3A is a schematic cross-sectional view of an X-ray sensing device according to an embodiment of the invention.
Figure 3B:
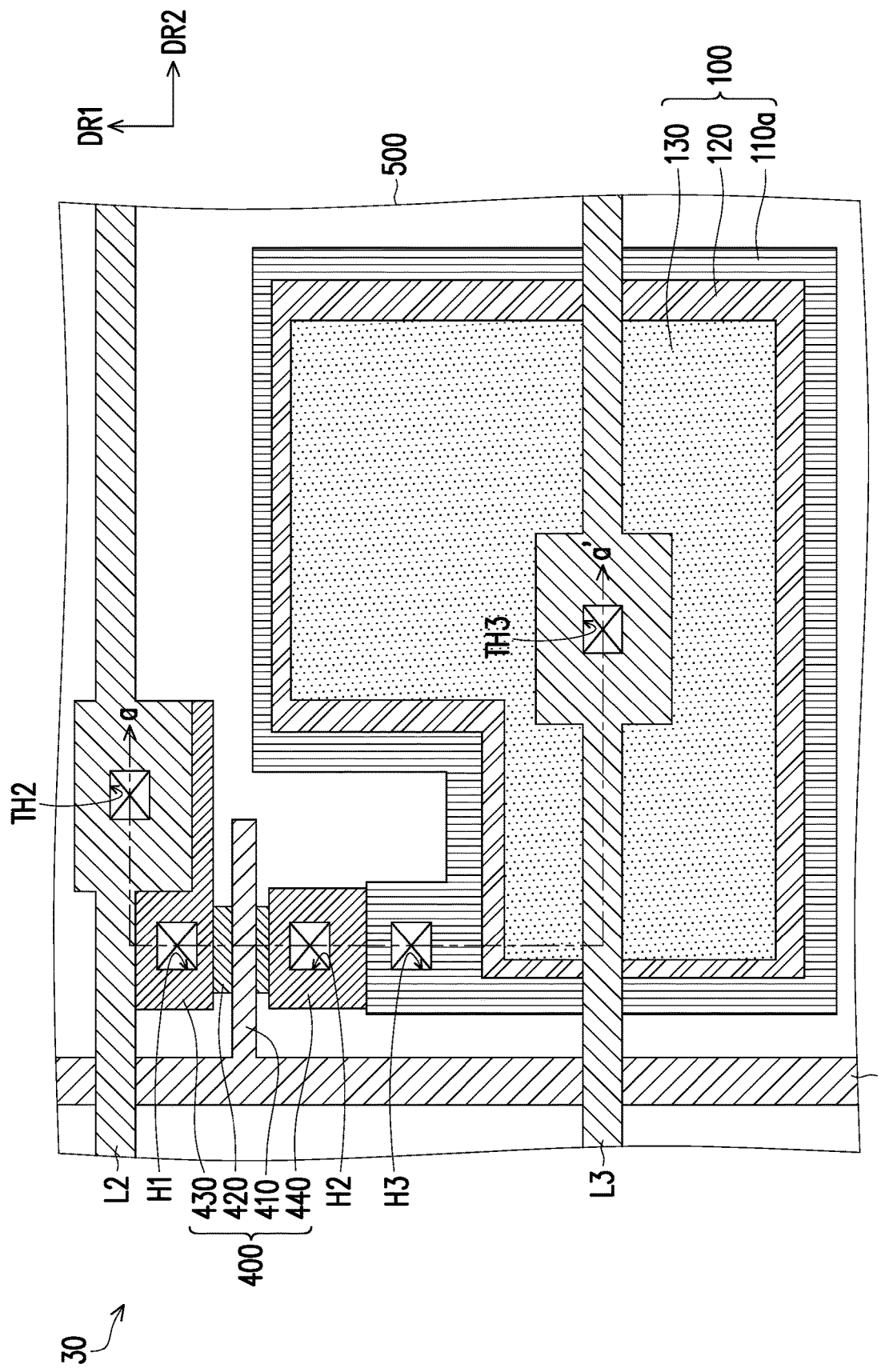
FIG. 3B is a schematic top view of an X-ray sensing device according to an embodiment of the invention.

FIG. 3A is a schematic cross-sectional view of an X-ray sensing device according to an embodiment of the invention. FIG. 3B is a schematic top view of an X-ray sensing device according to an embodiment of the invention. FIG. 3A corresponds to the position of the line a-a' in FIG. 3B, and part of the components in FIG. 3A are omitted in FIG. 3B.

It should be noted herein that, in embodiments provided in FIG. 3A and FIG. 3B, element numerals and partial content of the embodiments provided in FIG. 1A and FIG. 1B are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 3A and FIG. 3B, in the X-ray sensing device 30, the active element layer AL is formed on the substrate 500.

The substrate 500 overlaps the lead-containing glass 200. The substrate 500 may be a glass substrate or a flexible substrate. The active element 400 and the photosensitive element 100 are located between the substrate 500 and the lead-containing glass 200. In this embodiment, the first surface 202 of the lead-containing glass 200 faces the active element layer AL, and the second surface 204 of the lead-containing glass 200 faces the X-ray conversion structure 300.

The active element 400 is formed on the substrate 500. In this embodiment, the active element 400 includes a gate 410, a semiconductor channel layer 420, a source 430, and a drain 440.

The semiconductor channel layer 420 is formed on the substrate 500. In some embodiments, the semiconductor channel layer 420 includes two conductive regions 422 and a channel region 424 located between the two conductive regions 422. In some embodiments, the doping concentration of the conductive region 422 is different from the doping concentration of the channel region 424.

The first signal line L1 and the gate 410 are formed on the substrate 500. The gate 410 is overlapping with the channel region 424 of the semiconductor channel layer 420, and a gate insulating layer 450 is sandwiched between the gate 410 and the semiconductor channel layer 420. In this embodiment, the first signal line L1 is electrically connected to the gate 410. The first signal line L1 and the gate 410 belong to the same conductive layer. For example, the first signal line L1 and the gate 410 are formed by patterning the same conductive material layer. In some embodiments, the gate insulating layer 450, the first signal line L1 and the gate 410 are patterned through the same etching process.

In this embodiment, the gate insulating layer 450 is only located between the gate 410 and the semiconductor channel layer 420 and between the first signal line L1 and the semiconductor channel layer 420, but the invention is not limited to this. In other embodiments, the gate insulating layer 450 is not patterned through the same etching process as the first signal line L1 and the gate 410, and the gate insulating layer 450 extends from the semiconductor channel layer 420 onto the substrate 500.

The interlayer dielectric layer ILD is formed on the first signal line L1, the gate 410, the semiconductor channel layer 420 and the substrate 500.

The source 430 and the drain 440 are formed on the interlayer dielectric layer ILD. The source 430 and the drain 440 are respectively electrically connected to the semiconductor channel layer 420 through the through holes H1 and H2, wherein the through holes H1 and H2 penetrate the interlayer dielectric layer ILD. The source 430 is electrically connected to the second signal line L2. In this embodiment, the source 430 and the drain 440 belong to the same conductive film layer. For example, the source 430 and the drain 440 are formed by patterning the same conductive material layer.

In this embodiment, the active element 400 is illustrated by taking a top gate type thin film transistor as an example, but the invention is not limited thereto. According to other embodiments, the active element 400 is a bottom gate type thin film transistor or other types of thin film transistors.

The insulating layer BP1 is located on the active element 400. The photosensitive element 100 is located on the insulating layer BP1, and the lead-containing glass 200 is overlapping with the photosensitive element 100. The photosensitive element 100 includes a first electrode 110*a*, a photosensitive layer 120 and a second electrode 130.

The first electrode 110*a* is formed on the insulating layer BP1 and is electrically connected to the drain 440 of the active element 400 through the through hole H3, wherein the through hole H3 penetrates the insulating layer BP1. In this embodiment, the first electrode 110*a* includes a transparent conductive material or a light-reflecting conductive material.

The photosensitive layer 120 is formed on the first electrode 110*a*. The second electrode 130 is formed on the photosensitive layer 120. In this embodiment, the first electrode 110*a* is closer to the substrate 500 than the second electrode 130, and the second electrode 130 is closer to the lead-containing glass 200 than the first electrode 110*a*. In some embodiments, the second electrode 130 includes a transparent conductive material, such as indium tin oxide, indium zinc oxide, aluminum tin oxide, aluminum zinc oxide, indium gallium zinc oxide, or stacked layers of at least two of the foregoing materials, but the present invention is not limited thereto.

The insulating layer PV1 is formed on the photosensitive element 100 and the insulating layer BP1. The flat layer PL is formed on the insulating layer PV1. The through hole TH1 penetrates the flat layer PL and the insulating layer PV1. The insulating layer PV2 is formed on the flat layer PL.

The second signal line L2 and the third signal line L3 are formed on the insulating layer PV2. The second signal line L2 is electrically connected to the source 430 of the active element 400 through the through hole TH2, wherein the through hole TH2 penetrates the insulating layer BP1, the insulating layer PV1, the flat layer PL, and the insulating layer PV2. The third signal line L3 is electrically connected to the second electrode 130 of the photosensitive element 100 through the through hole TH3, wherein the through hole TH3 is overlapping with the through hole TH1, and the through hole TH3 penetrates the insulating layer PV2.

The second signal line L2 and the third signal line L3 belong to the same conductive layer. For example, the second signal line L2 and the third signal line L3 are formed by patterning the same layer of conductive material. The insulating layer PV3 covers the second signal line L2 and the third signal line L3. In some embodiments, other insulating materials or encapsulate materials are also included between the insulating layer PV3 and the lead-containing glass 200, but the present invention is not limited thereto.

In this embodiment, the X-ray Z1 enters the X-ray sensing device 30 from one side of the X-ray conversion structure 300. The X-ray conversion structure 300 is configured to at least partially convert the X-ray Z1 into light Z2 having a first wavelength. In the present embodiment, the X-ray conversion structure 300 converts 40% to 95% of the X-ray Z1 into light Z2 with the first wavelength, and another part of the unconverted X-ray Z3 passes through the X-ray conversion structure 300. In this embodiment, the light Z2 is visible light, and the first wavelength is 400 nm to 700 nm.

Since the transmittance of the lead-containing glass 200 to visible light with a wavelength of 400 nm to 700 nm (for example, 550 nm) is greater than or equal to about 85%, most of the light Z2 can pass through the lead-containing glass 200. The photosensitive element 100 is configured to sense light Z2 having a first wavelength. Since most of the light Z2 can pass through the lead-containing glass 200, the resolution of the X-ray sensing device 30 will not be significantly affected by the lead-containing glass 200.

In addition, the transmittance of the lead-containing glass 200 for X-ray Z3 with a wavelength of about 0.1 nanometers to 10 nanometers is less than or equal to about 11.6%. Only a small portion of the X-rays Z3 or no X-rays Z3 can pass through the lead-containing glass 200. Therefore, it is possible to prevent the active element 400 from deteriorating due to being irradiated by the X-ray Z3.

Figure 4A:
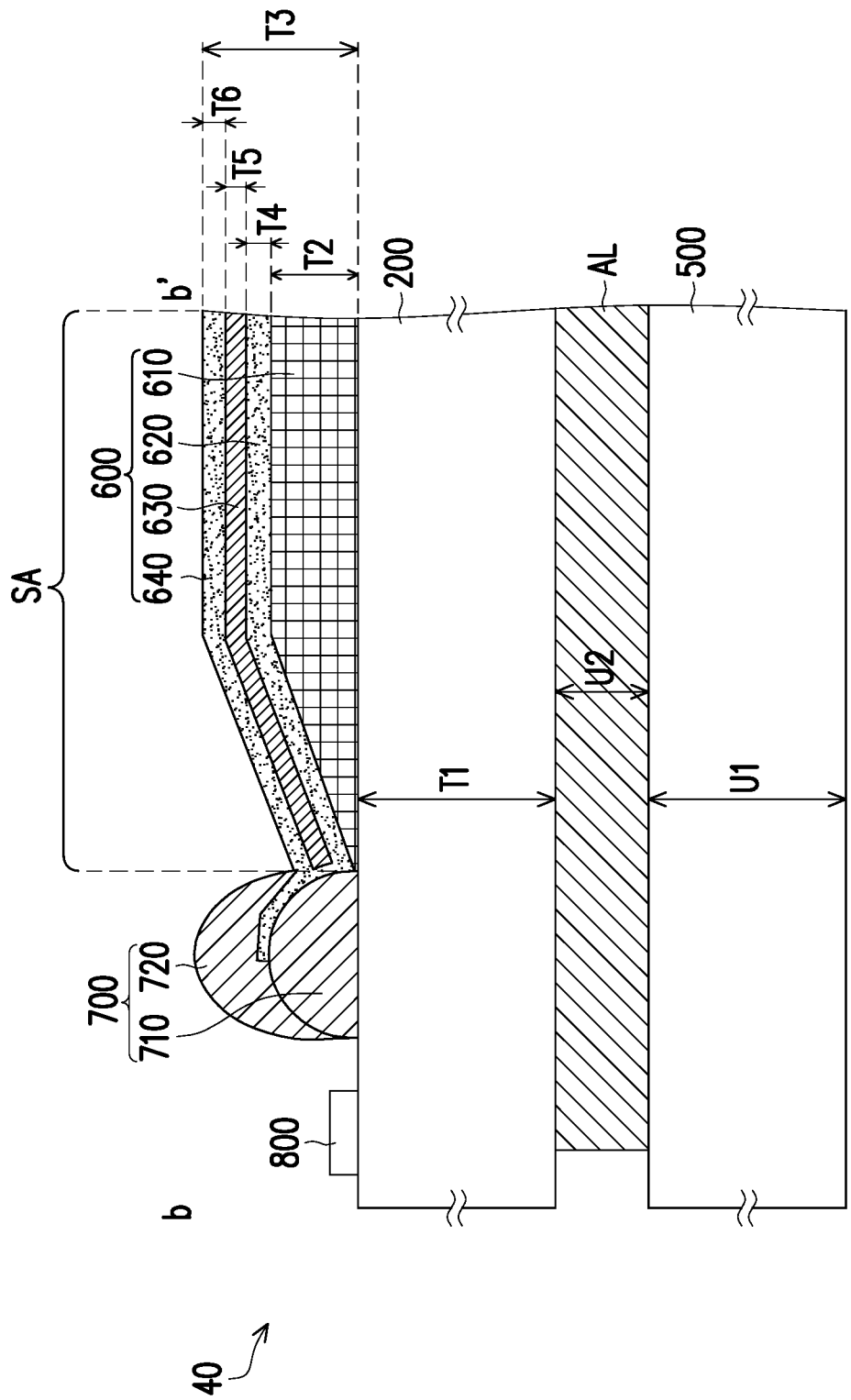
FIG. 4A is a schematic cross-sectional view of an X-ray sensing device according to an embodiment of the invention.
Figure 4B:
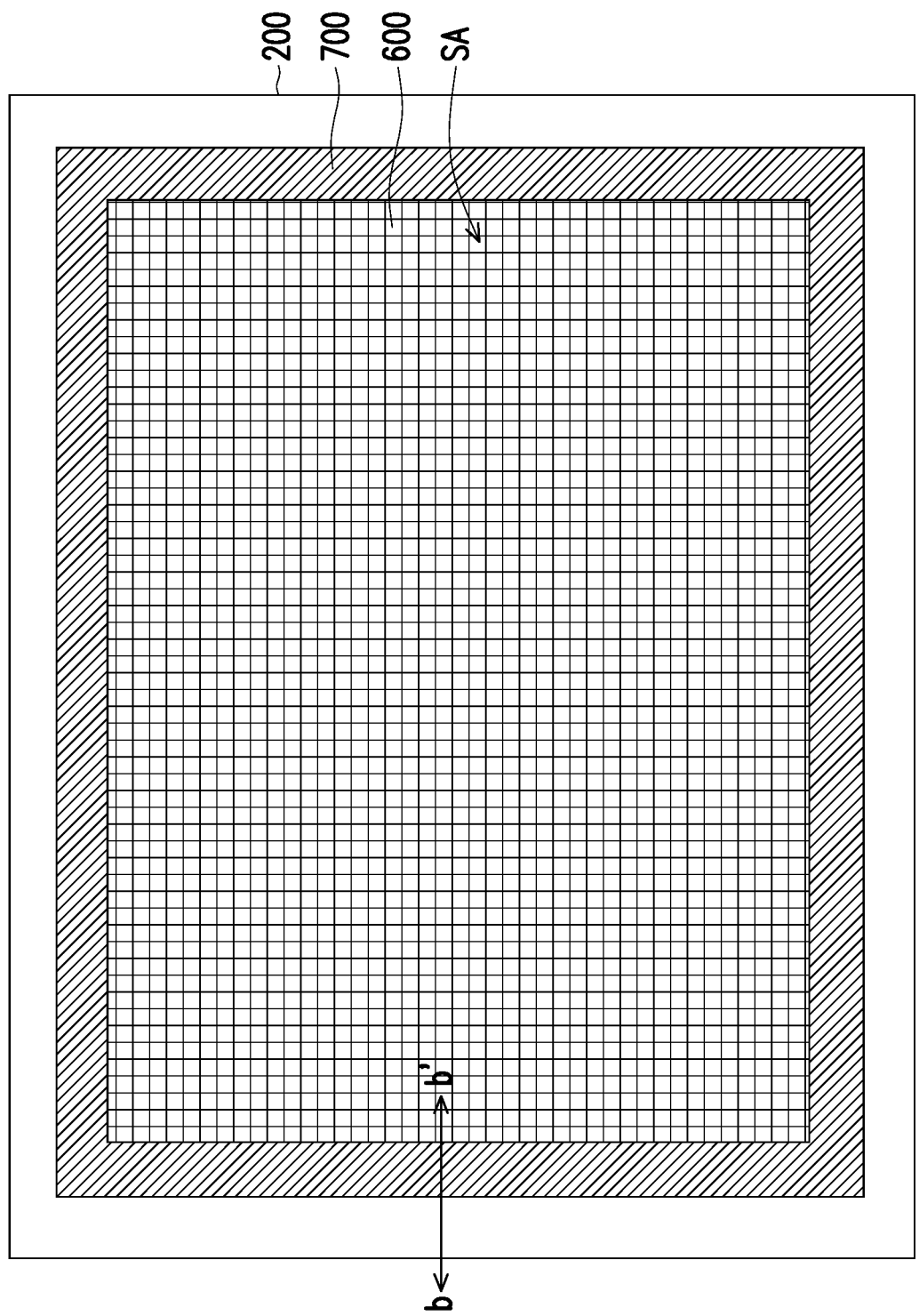
FIG. 4B is a schematic top view of an X-ray sensing device according to an embodiment of the invention.

FIG. 4A is a schematic cross-sectional view of an X-ray sensing device according to an embodiment of the invention. FIG. 4B is a schematic top view of an X-ray sensing device according to an embodiment of the invention. FIG. 4A corresponds to the position of the line b-b' in FIG. 4B, and part of the components in FIG. 4A are omitted in FIG. 4B.

It should be noted herein that, in embodiments provided in FIG. 4A and FIG. 4B, element numerals and partial content of the embodiments provided in FIG. 3A and FIG. 3B are followed, the same or similar reference numerals being used to represent the same or similar elements, and description of the same technical content being omitted. For a description of an omitted part, reference may be made to the foregoing embodiment, and the descriptions thereof are omitted herein.

Referring to FIG. 4A and FIG. 4B, the X-ray sensing device 40 includes a substrate 500, an active element layer AL, a lead-containing glass 200, and an X-ray conversion structure 600, the active element layer AL is located between the substrate 500 and the lead-containing glass 200, and the lead-containing glass 200 is located between the active element layer AL and the X-ray conversion structure 600. In some embodiments, the thickness U1 of the substrate 500 is 0.5 mm to 0.7 mm, the thickness U2 of the active element layer AL is less than 10 μm, and the thickness T1 of the lead-containing glass 200 is 0.5 mm to 3 mm.

In this embodiment, the X-ray sensing device 40 further includes a bank structure 700. The bank structure 700 surrounds the X-ray conversion structure 600. In this embodiment, the X-ray conversion structure 600 includes a scintillator layer 610, a first protection layer 620, a metal layer 630, and a second protection layer 640.

The bank structure 700 is formed on the lead-containing glass 200. In this embodiment, the bank structure 700 includes a multi-layer structure. For example, the bank structure 700 includes a first layer 710 and a second layer 720.

The first layer 710 of the bank structure 700 is formed on the lead-containing glass 200 and defines the sensing area SA. The first layer 710 surrounds the sensing area SA.

The scintillator layer 610 is formed on the lead-containing glass 200 and is surrounded by the bank structure 700. In this embodiment, the scintillator layer 610 is formed in the sensing area SA above the lead-containing glass 200 by evaporation. In some embodiments, the scintillator layer 310 includes thallium-activated cesium iodide scintillators (CsI: Tl scintillators). The thickness T2 of the scintillator layer 310 is, for example, 500 μm±100 μm.

The first protection layer 620 is formed on the scintillator layer 610. In this embodiment, the first protection layer 620 extends from the scintillator layer 610 onto the first layer 710 of the bank structure 700. The thickness T4 of the first protection layer 620 is, for example, 20 µm±4 µm.

The second layer 720 of the bank structure 700 is formed on the first layer 710 of the bank structure 700, and the second layer 720 surrounds the sensing area SA. In this embodiment, the first protection layer 620 extends from the scintillator layer 610 into the first layer 710 and the second layer 720 of the bank structure 700.

The metal layer 630 is formed on the first protection layer 620 and is overlapping with the scintillator layer 610. In this embodiment, the metal layer 630 is formed in the sensing area SA above the lead-containing glass 200 by evaporation. In some embodiments, the material of the metal layer 630 includes aluminum, and the thickness T5 of the metal layer 630 is, for example, 0.2 µm to 0.3 µm.

The second protection layer 640 is formed on the metal layer 630. The thickness T6 of the second protection layer 640 is, for example, 20 µm±4 µm.

In this embodiment, the total thickness T3 of the X-ray conversion structure 600 is about 0.5 mm to 1.4 mm.

In this embodiment, the light sensing device 40 optionally includes a liner 800. The liner 800 is suitable for supporting the photomask during the evaporation process. For example, the photomask is supported during the evaporation process of the scintillator layer 610 and during the evaporation process of the metal layer 630. In this embodiment, the bank structure 700 is benefit to increase the yield of the evaporation process, and prevents the scintillator layer 610 and/or the metal layer 630 from contaminating the area outside the sensing area SA.

What is claimed is:

1. An X-ray sensing device, comprising:
a photosensitive element configured to sense light having a first wavelength;
a lead-containing glass overlapping with the photosensitive element; and
an X-ray conversion structure arranged on the lead-containing glass, and the lead-containing glass is located between the photosensitive element and the X-ray conversion structure, wherein the X-ray conversion structure is configured to at least partially convert X-rays into light having the first wavelength, wherein the X-ray conversion structure comprises:
a scintillator layer;
a metal layer overlapping with the scintillator layer;
an anti-moisture layer surrounding the scintillator layer and the metal layer;
a first flexible substrate having a first surface and a second surface opposite to the first surface, wherein the scintillator layer is formed on the first surface;
an adhesive layer formed on the second surface; and
a second flexible substrate overlapping with the first flexible substrate, wherein the metal layer is formed on the second flexible substrate, and the adhesive layer is adhered to the metal layer, wherein the anti-moisture layer surrounds the first flexible substrate, the scintillator layer, the adhesive layer, the metal layer, and the second flexible substrate.

2. The X-ray sensing device of claim 1, wherein a weight percentage of lead oxide in the lead-containing glass is 10 wt % to 75 wt %, and a thickness of the lead-containing glass is 0.5 mm to 5 mm.

3. The X-ray sensing device of claim 1, further comprises:
an active element formed above the lead-containing glass, wherein the photosensitive element includes:
a first electrode electrically connected to the active element, wherein the first electrode comprises a transparent conductive material;
a photosensitive layer formed on the first electrode; and
a second electrode formed on the photosensitive layer, wherein the first electrode is closer to the lead-containing glass than the second electrode.

4. The X-ray sensing device of claim 1, further includes:
an optical glue layer is formed on the lead-containing glass, and the optical glue layer is bonded to the X-ray conversion structure.

5. The X-ray sensing device as described in claim 1, further comprises:
a substrate overlapping with the lead-containing glass;
an active element formed on the substrate, and the active element and the photosensitive element are located between the substrate and the lead-containing glass, wherein the photosensitive element comprises:
a first electrode electrically connected to the active element;
a photosensitive layer formed on the first electrode; and
a second electrode formed on the photosensitive layer, wherein the first electrode is closer to the substrate than the second electrode, and the second electrode comprises a transparent conductive material.

6. An X-ray sensing device, comprising:
a photosensitive element configured to sense light having a first wavelength;
a lead-containing glass overlapping with the photosensitive element;
an X-ray conversion structure arranged on the lead-containing glass, and the lead-containing glass is located between the photosensitive element and the X-ray conversion structure, wherein the X-ray conversion structure is configured to at least partially convert X-rays into light having the first wavelength; and
a bank structure located above the lead-containing glass and surrounding the X-ray conversion structure, wherein the X-ray conversion structure comprises:
a scintillator layer formed on the lead-containing glass and surrounded by the bank structure;
a first protection layer formed on the scintillator layer;
a metal layer formed on the first protection layer and overlapping with the scintillator layer; and
a second protection layer formed on the metal layer.

7. The X-ray sensing device of claim 4, wherein the bank structure comprises a multilayer structure, and the first protection layer extends from the scintillator layer into the bank structure.

* * * * *